(12) United States Patent
Lee et al.

(10) Patent No.: US 7,993,776 B2
(45) Date of Patent: *Aug. 9, 2011

(54) CONNECTION APPARATUS OF BATTERY CELL MODULE

(75) Inventors: Cheol-Sub Lee, Daegu (KR);
Jong-Keun Song, Daegu (KR);
Young-Jun Yun, Daegu (KR);
Keun-Tak Lim, Gyeongbuk (KR)

(73) Assignee: Tyco Electronics AMP Korea, Ltd., Kyungsangbuk-Do (KR)

( * ) Notice: Subject to any disclaimer, the term of this patent is extended or adjusted under 35 U.S.C. 154(b) by 1060 days.

This patent is subject to a terminal disclaimer.

(21) Appl. No.: 11/694,298

(22) Filed: Mar. 30, 2007

(65) Prior Publication Data

US 2007/0238018 A1    Oct. 11, 2007

(30) Foreign Application Priority Data

Apr. 7, 2006    (KR) ................ 10-2006-0031988

(51) Int. Cl.
*H01M 6/42* (2006.01)
*H01M 6/46* (2006.01)
*H01M 2/22* (2006.01)
*H01M 2/24* (2006.01)
*H05K 7/00* (2006.01)
*H05K 1/14* (2006.01)

(52) U.S. Cl. ........ 429/159; 429/152; 429/153; 429/156; 429/160; 429/163; 429/178; 361/729; 361/736; 361/760

(58) Field of Classification Search ............ 429/153, 429/158, 159
See application file for complete search history.

(56) References Cited

U.S. PATENT DOCUMENTS

| 2006/0088761 A1* | 4/2006 | Ota et al. ............. 429/130 |
| 2009/0220853 A1* | 9/2009 | Yang et al. ............ 429/159 |
| 2010/0021802 A1* | 1/2010 | Yang et al. ............. 429/91 |

FOREIGN PATENT DOCUMENTS

WO    WO 2007102669 A1 *    9/2007

* cited by examiner

*Primary Examiner* — Robert Hodge
(74) *Attorney, Agent, or Firm* — Barley Snyder LLC

(57) ABSTRACT

A connection apparatus of a battery cell module having a battery cell cover with connecting plates formed at opposing ends thereof, a main frame having guide channels that receive the cell cover, and a top cover to secured the cell cover to the main frame, the connection apparatus having holes at opposing sides of a bottom of the main frame, connecting units configured for insertion into the holes and for contacting the connecting plates, and a conductive bridge electrically connecting the connecting units is disclosed.

9 Claims, 7 Drawing Sheets

CONNECTION APPARATUS OF BATTERY CELL MODULE

CROSS-REFERENCE TO RELATED APPLICATIONS

This application claims the benefit of the filing date under 35 U.S.C. §119(a)-(d) of Korean Patent Application Number 10-2006-0031988 of Apr. 7, 2006.

FIELD OF THE INVENTION

The present invention relates to a connection apparatus of a battery cell module. More particularly, the present invention relates to a connection apparatus of a battery cell module having connecting units configured for insertion into holes of a main frame.

BACKGROUND

Generally, a large capacity battery is mounted in an electric vehicle or a hybrid vehicle. The electric vehicle or the hybrid vehicle is driven by electric energy stored in the battery.

The battery is charged and discharged according to acceleration or deceleration of vehicle speed, and due to this the status of charging and discharging of the battery must be continuously monitored by an electronic control unit (ECU, hereinafter referred to "ECU") of the vehicle. The ECU is a determining factor of the performance and quality of a vehicle.

A battery cell module 100 used in the electric vehicle or the hybrid vehicle as described above, as illustrated in Prior Art FIG. 7, includes respective cell covers 110 into which a plurality of battery cells 112 are inserted to be protected from external shock and vibration, a main frame 120 having guide channels 122 into which the cell covers 110 are inserted to be installed, and a top cover 130 to secure the cell covers 110 to the main frame 120.

Moreover, the plurality of battery cells 112 are electrically connected to each other in such a way that conductive connecting plates 112a, which are formed at both ends thereof, are welded to other connecting plates 112a of adjacent battery cells 112, and are configured for mounting in the main frame 120.

In the conventional battery cell module 100 shown in Prior Art FIG. 7, in order to check the charging and discharging status, the connecting plates 112a are first connected to respective lead wires that are connected to the ECU, thereby connecting the battery cell module 100 and the ECU. Since the connection between the connecting plates 112a and the ECU is carried out by connecting a plurality of lead wires one by one, the connection is troublesome, it takes time to manufacture, and the overall structure of the battery cell module becomes very complicated.

Moreover, due to the complicated structure, it causes interference with other equipment around the battery cell module and the operational environment is remarkably deteriorated.

SUMMARY

The present invention relates to a connection apparatus of a battery cell module having a battery cell cover with connecting plates formed at opposing ends thereof, a main frame having guide channels that receive the cell cover, and a top cover to for secured the cell cover to the main frame, the connection apparatus having holes at opposing sides of a bottom of the main frame, connecting units configured for insertion into the holes and for contacting the connecting plates, and a conductive bridge electrically connecting the connecting units.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
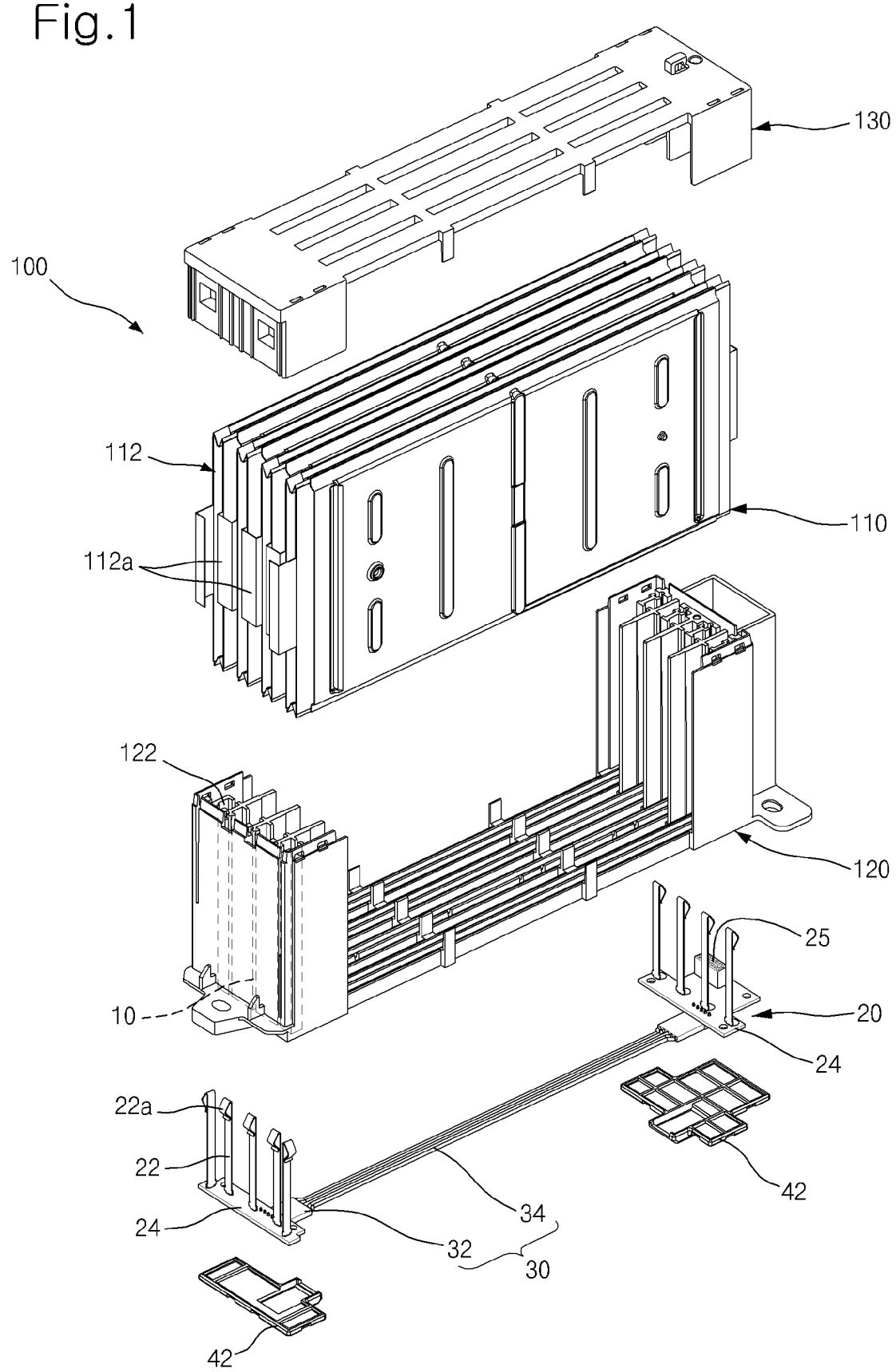
FIG. 1 is an exploded oblique view of a main part of a battery cell module 100 according to an embodiment of the present invention.
Figure 2:
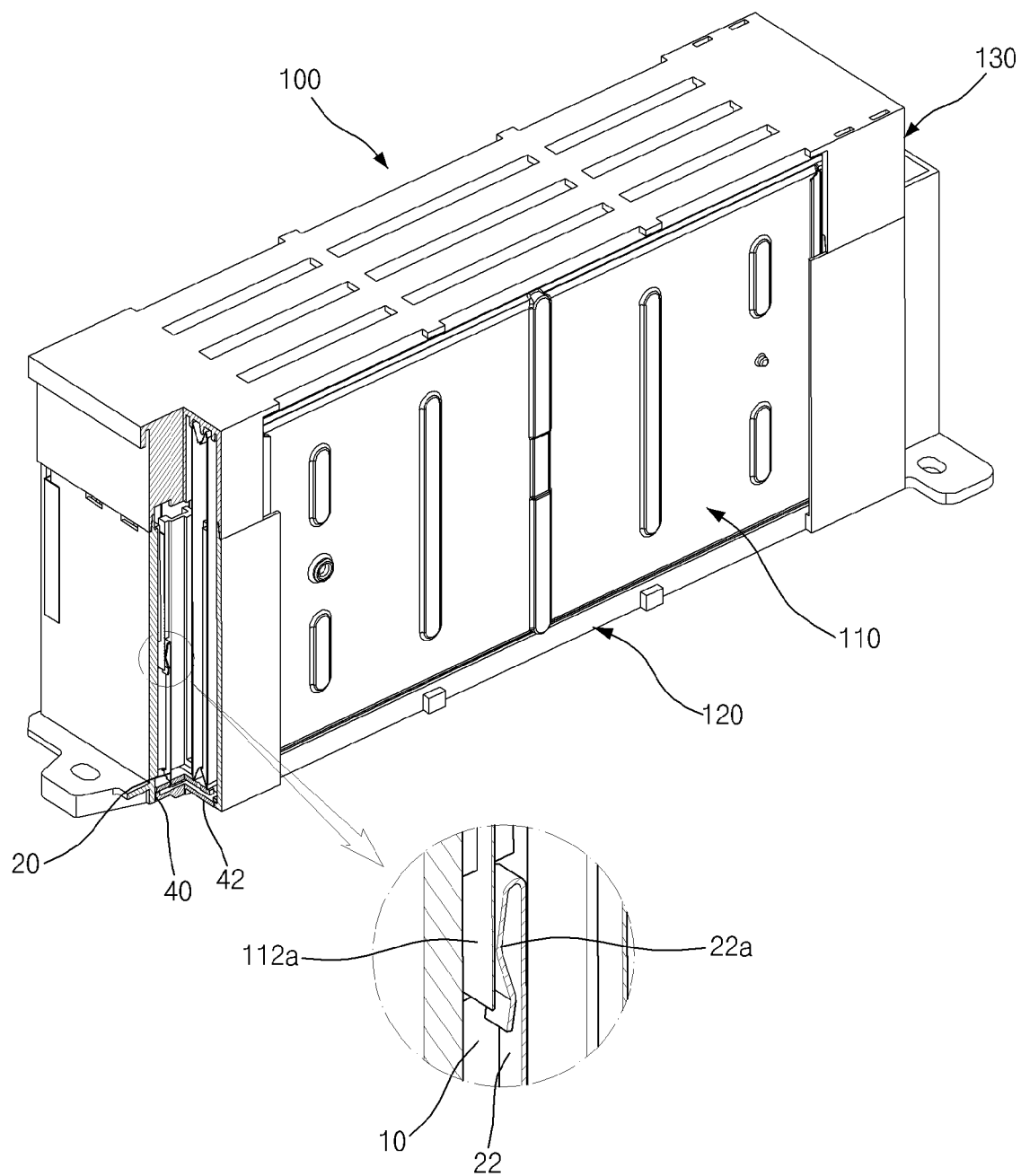
FIG. 2 is an oblique cut-away view of the main part of the battery cell module of FIG. 1.
Figure 3:
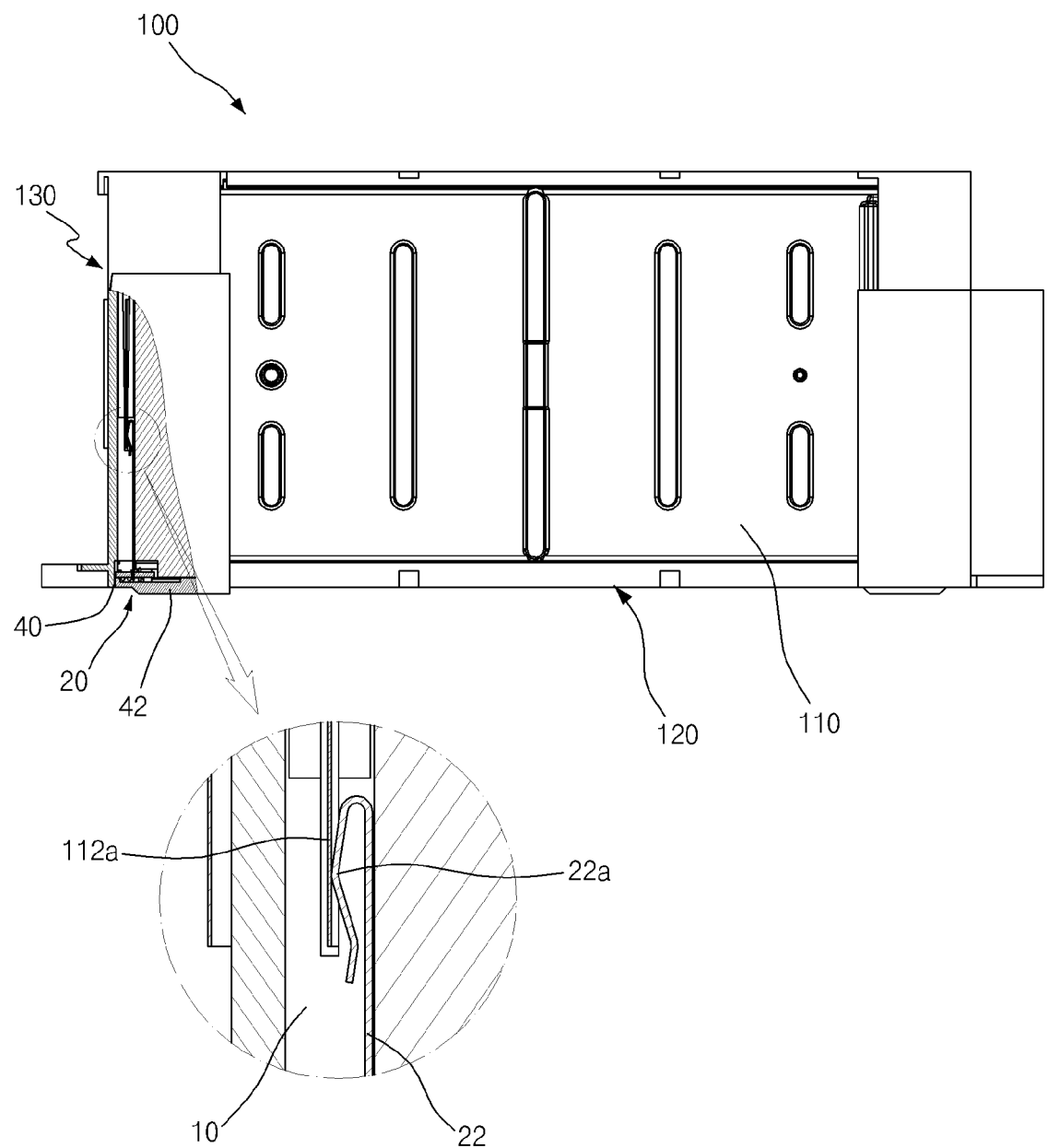
FIG. 3 is an orthogonal cut-away view of the main part of the battery cell module of FIG. 1.

Hereinafter, a battery cell module according to the embodiments of the present invention will be described in detail with reference to the accompanying drawings.

As illustrated, a battery cell module 100 comprises a plurality of battery cells 112 inserted in series to each other into connecting plates 112a formed at both ends of respective cell covers 110, a main frame 120 into which the cell covers 110 are inserted along guide channels 122, and a top cover 130 to secure the cell covers 110 to the main frame 120 and to be connected to an electronic control unit (ECU) of a vehicle using electrical energy. According to an embodiment of the present invention, battery cell module 100 further comprises a connecting apparatus in order to provide a structure simpler than that of the conventional battery cell module 100 to allow a simpler electrical connection between the battery cells 112 and the ECU. The connecting apparatus comprises holes 10 formed at both sides of a bottom surface of the main frame 120 which is connected to the connecting plates 112a (which are connected to each other by welding) such that the battery cells 112 are inserted into the guide channels 122. The battery cells 112 are thus electrically connected to each other, respective connecting units 20 which are inserted into the holes 10 to be connected to the connecting plates 112a for supplying electricity to the ECU, and a conductive bridge 30 for electrically connecting the connecting units 20 to each other using an electrical conductor.

The connecting units 20 comprise a plurality of terminals 22 which are inserted into the holes 10 and resiliently contact the connecting plates 112a and conventional printed circuit boards 24 to which the terminals 22 are electrically joined by soldering.

Each of the terminals 22 resiliently contacts a side of each of the respective connecting plates 112a and may comprise bent resilient contacts 22a formed at the top of the terminal 22 such that each of the terminals 22 stably and firmly contacts the inner surface of each of the connecting plates 112a.

The conductive bridge 30 comprises bridge connectors 32 integrally formed with an end of each of the printed circuit boards 24, or separately fabricated to be electrically connected to the printed circuit boards 24 by soldering or insertion, and a bridge conductor 34 such as a plurality of conventional lead wires to connect the bridge connectors 32 to each other or a printed circuit board 24.

The printed circuit boards 24 further comprise connectors 25 electrically connected and secured to one of the printed circuit boards 24 such that one of the printed circuit boards 24 can be more conveniently connected to the ECU of the vehicle in comparison to the conventional connector.

The main frame 120 further comprises mounting grooves 40 formed at bottom sides thereof such that the printed circuit boards 24 are mounted thereto, and retainers 42 secure the printed circuit boards 24 to the bottom of the main frame 120. By doing so, it is possible to prevent the printed circuit boards 24 from being exposed to the exterior and to prevent an error from occurring in the printed circuit boards 24 due to electrical leakage. In this case, a plurality of protrusions are formed in the mounting grooves 40 of the main frame 120 and insertion grooves formed at corresponding positions of the printed circuit boards 24 installed to the main frame 120 so that the printed circuit board 24 can be secured to the main frame 120.

As such, the cell covers 110 are inserted into the guide channels 122 of the main frame 120 and the top cover 130 is secured to the main frame 120 to prevent the cell covers 110 from being vibrated.

Next, the terminals 22 of the printed circuit boards 24 of the connecting units 20 are inserted into the mounting grooves 40 formed in the bottom of the main frame 120 to be connected to the connecting plates 112a in the guide channels 122 formed in both sides of the bottom of the main frame 120 such that the resilient contacts 22a formed at the tops of the terminals 22 electrically and firmly contact the connecting plates 112a. In this case, the printed circuit boards 24 at the lateral sides are electrically connected to each other by electrically connecting the bridge connectors 32 with a bridge conductor 34 such as through the use of a plurality of lead wires.

Next, the retainers 42 are secured on the printed circuit boards 24 so that the electrical connection between the battery cells 110 and the connecting units 20 can be easily and conveniently established without a complicated structure.

As such, after the electrical connection between the battery cells 110 and the connecting units 20 is completed, the connector 25 formed in one of the printed circuit boards 24 of the connecting units 20 is connected to conventional connectors of the ECU of the vehicle so that the connection between the battery cell module 100 and the ECU can also be easily established.

Therefore, the electrical connection between the battery cell module 100 and the ECU can be simply established without complication and the structure of the battery cell module 100 is not complicated and can be connected by using a simple structure.

Figure 4:
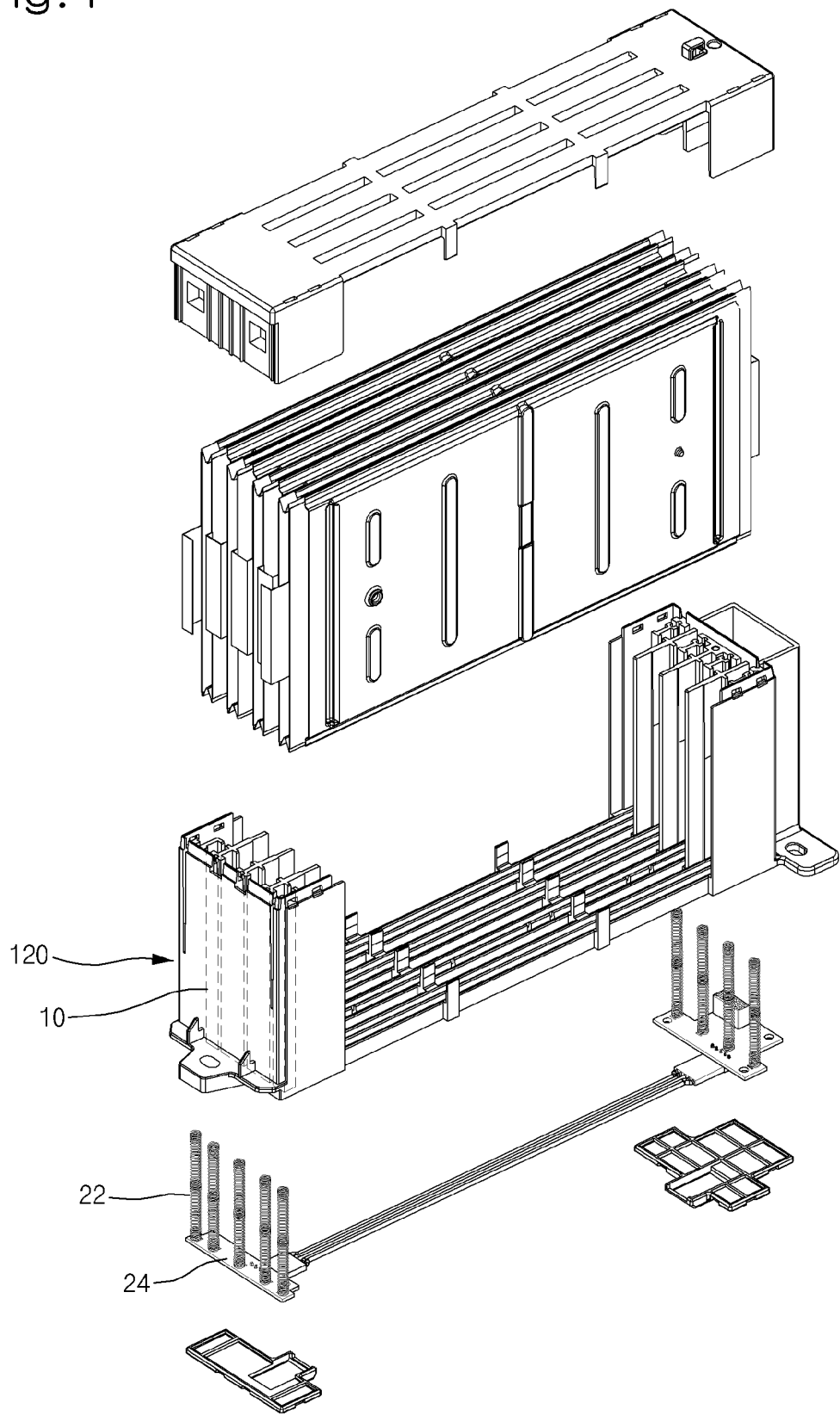
FIG. 4 is an exploded oblique view of a main part of a battery cell module according to another embodiment of the present invention.
Figure 5:
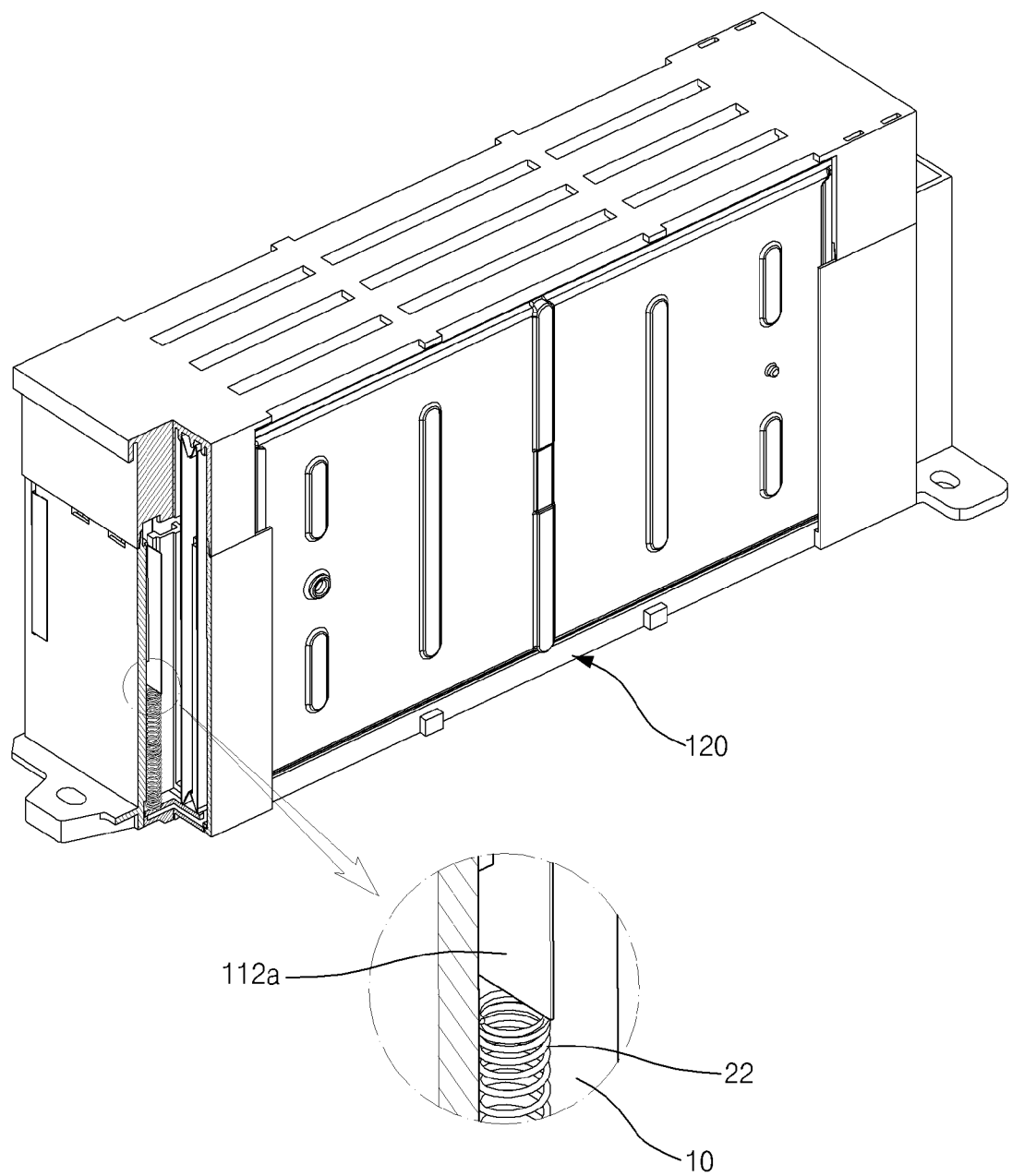
FIG. 5 is an oblique cut-away view of the main part of the battery cell module of FIG. 4.
Figure 6:
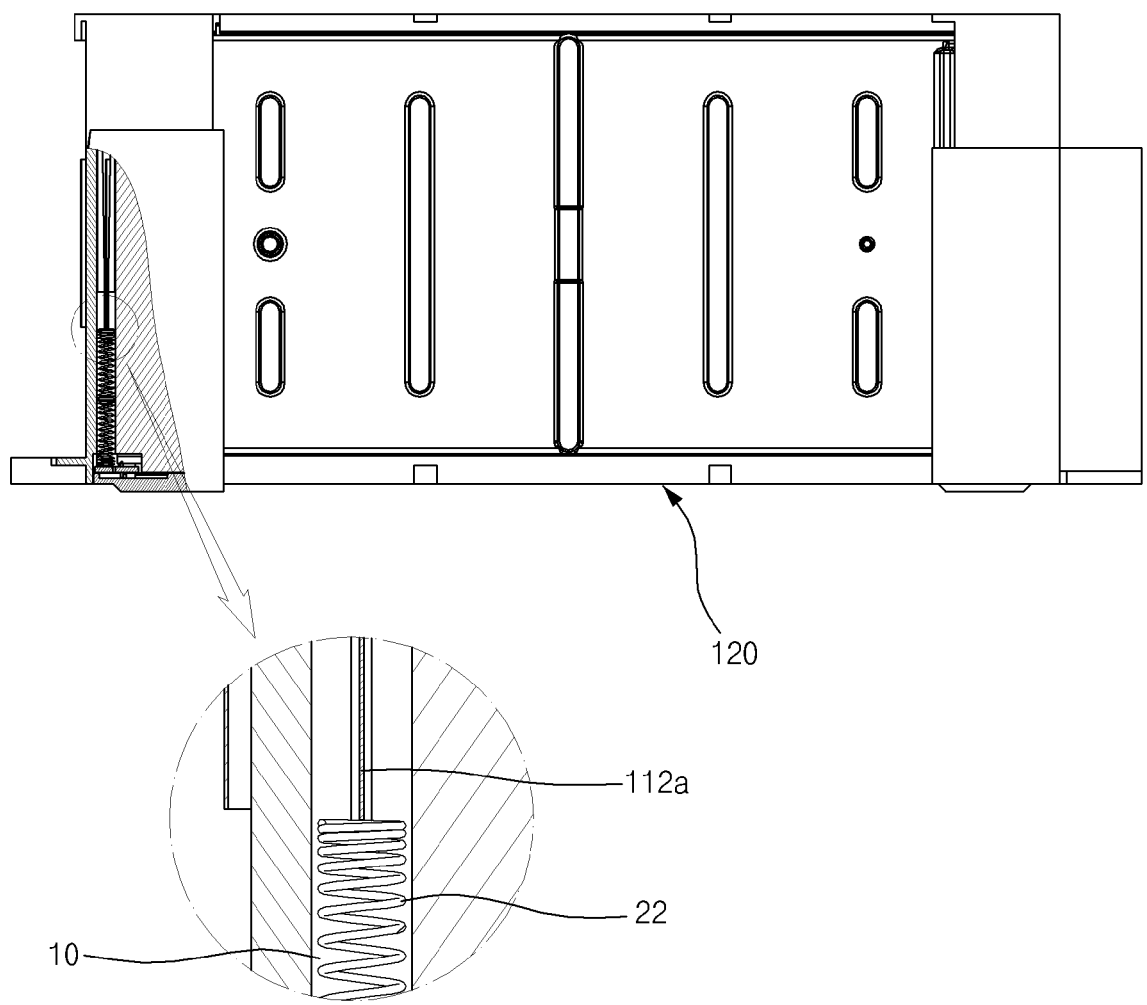
FIG. 6 is an orthogonal cut-away view of the main part of the battery cell module of FIG. 4; and Prior Art
Figure 7:
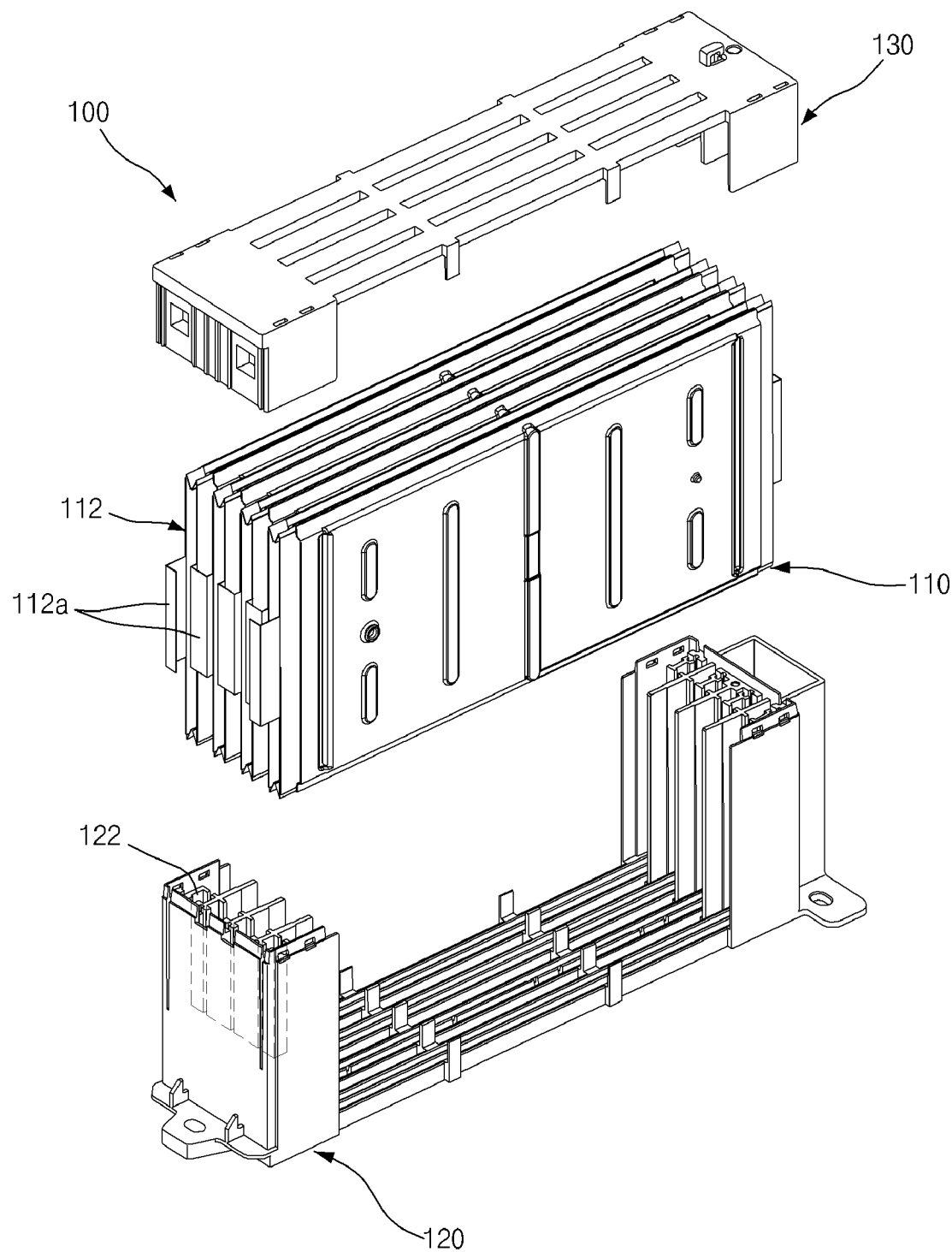
FIG. 7 is an exploded oblique view of a main part of a conventional battery cell module.

Another embodiment of the present invention is illustrated in FIGS. 4-6. Here, a plurality of the battery cells 112 inserted into the cell covers 110 are connected to each other through the connecting plates 112a in series, and are connected by the connecting units 20 in the guide channel 122 of the main frame. In order for the terminals 22 inserted into the connecting plates 112a and contacting the inner surfaces of the connecting plates 112a to more firmly contact each other (like the terminals 22 having resilient contacts 22a, as described above), the terminals 22, are inserted into the holes 10 to contact the lower sides of the connecting plates 112a and to be electrically connected to the connecting plates 112a. In this case, the terminals 22 may be coil springs.

As such, although the above-described terminals 22 are inserted into the connecting plates 112a to contact the inner surfaces of the connecting plates 112a the coil spring terminals 22 are inserted into the holes 10, simultaneously the printed circuit boards 24 are mounted into the mounting grooves 40, and the retainers 42 are fixed thereto, so that tops of the coil spring terminals 22 are compressed by the lower sides of the connecting plates 112 causing the coil spring terminals 22 to resiliently and firmly contact the connecting plates 112a.

Therefore, the connecting units 20 to connect the battery cells 112 in series are connected to the connecting plates 112 resiliently supported by the compression of the coil spring terminals 22 so that the electrical connection can be securely and firmly maintained even when the battery cell module 100 vibrates during the traveling of the vehicle in which the battery cell module is mounted.

As described above, according to the present invention, a plurality of battery cells 112 and the ECU, provided in a vehicle using electrical energy, are electrically connected to each other by a simple and firm manner using the connecting units 20 to simplify a battery cell module 100 so that the time required to connect the battery cell module 100 to the ECU can be remarkably reduced, the battery cell module 100 may have a simple structure, and due to the simple structure, interference with equipment around the battery cell module 100 can be also prevented.

Moreover, the mounting grooves 40 of the main frame 120 into which the printed circuit boards 24 of the connecting units 20 and the retainers 42 to cover the printed circuit boards 24 are provided to prevent electrical leakage.

Further, the printed circuit boards 24 of the connecting units 20 comprise connectors 25 to be connected to the ECU so that the connection with the ECU in a vehicle can be easier.

In addition, the resilient terminals 22 (such as the coil spring terminal and the terminal having a resilient contact 22a) having a resilience to compression forces are used as the terminals 22 of the connecting units 20 so that a firm connection to the battery cell module 100 can be maintained even when the battery cell module 100 vibrates due to vehicle travel.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A connection apparatus of a battery cell module having a battery cell cover with connecting plates formed at opposing ends thereof, a main frame having guide channels that receive the cell cover, and a top cover to secure the cell cover to the main frame, the connection apparatus comprising:
   holes at opposing sides of a bottom of the main frame;
   connecting units configured for insertion into the holes and for contacting the connecting plates, each connecting unit having a printed circuit board and a terminal secured to and electrically connected to the printed circuit board, and inserted into at least one of the holes and resiliently contacting at least one of the connecting plates; and
   a conductive bridge electrically connecting the connecting units.

2. The connection apparatus of a battery cell module according to claim 1, wherein the terminal resiliently contacts a side of the connecting plate and wherein the terminal comprises a bent resilient contact.

3. The connection apparatus of a battery cell module according to claim 2, wherein the bent resilient contact is located at a top of the terminal.

4. The connection apparatus of a battery cell module according to claim 1, wherein the terminal comprises a resilient conductor configured to contact a lower side of the connecting plate and wherein the terminal is compressed to electrically contact the connecting plate.

5. The connection apparatus of a battery cell module according to claim 1, the conductive bridge comprising:
   a bridge connector formed at an end of the printed circuit board; and
   a bridge conductor connected to the bridge connector.

6. The connection apparatus of a battery cell module according to claim 5, further comprising:
   at least two of the printed circuit boards, each printed circuit board having a bridge connector;
   wherein the bridge conductor electrically connects the bridge connectors.

7. The connection apparatus of a battery cell module according to claim 1, further comprising:
   a connector electrically connected to and secured to the printed circuit board.

8. The connection apparatus of a battery cell module according to claim 1, further comprising:
   a mounting groove formed at a bottom side of the main frame; and
   a retainer for securing the printed circuit board to the bottom of the main frame.

9. The connection apparatus of a battery cell module according to claim 1, wherein the terminal resiliently contacts a side of the connecting plate and wherein the terminal is a coil spring.

* * * * *